US005654237A

United States Patent [19]
Suguro et al.

[11] Patent Number: 5,654,237
[45] Date of Patent: *Aug. 5, 1997

[54] METHOD OF MANUFACTURING SEMICONDUCTOR DEVICE

[75] Inventors: Kyoichi Suguro, Yokohama; Haruo Okano, Tokyo, both of Japan

[73] Assignee: Kabushiki Kaisha Toshiba, Kawasaki, Japan

[*] Notice: The term of this patent shall not extend beyond the expiration date of Pat. No. 5,192,714.

[21] Appl. No.: 476,883

[22] Filed: Jun. 7, 1995

Related U.S. Application Data

[63] Continuation of Ser. No. 385,376, Feb. 7, 1995, Pat. No. 5,470,791, which is a continuation of Ser. No. 981,422, Nov. 25, 1992, abandoned, which is a division of Ser. No. 654,895, Feb. 13, 1991, Pat. No. 5,192,714.

[30] Foreign Application Priority Data

Feb. 14, 1990 [JP] Japan ................. 2-32689
Feb. 7, 1991 [JP] Japan ................. 3-016586

[51] Int. Cl.⁶ .......................... H01L 21/44; H01L 21/28; H01L 21/283
[52] U.S. Cl. .......................... 438/624; 438/631; 438/635; 438/637; 438/641; 438/675
[58] Field of Search ........................ 437/189, 190, 437/192, 195, 203, 235, 238, 245, 946, 240, 978

[56] References Cited

U.S. PATENT DOCUMENTS

| | | | |
|---|---|---|---|
| 4,448,800 | 5/1984 | Ehara et al. | 437/195 |
| 4,746,621 | 5/1988 | Thomas et al. | 437/200 |
| 4,948,755 | 8/1990 | Mo | 437/195 |
| 5,017,317 | 5/1991 | Marcus | 427/255.1 |
| 5,063,175 | 11/1991 | Broadbent | 437/192 |
| 5,068,207 | 11/1991 | Manocha et al. | 437/235 |
| 5,069,749 | 12/1991 | Gutierrez | 437/192 |
| 5,104,694 | 4/1992 | Saito et al. | 427/53.1 |
| 5,192,714 | 3/1993 | Suguro et al. | 437/195 |
| 5,290,358 | 3/1994 | Rubloff et al. | 437/235 |
| 5,304,510 | 4/1994 | Suguro et al. | 437/195 |
| 5,420,075 | 5/1995 | Homma et al. | 437/195 |
| 5,470,791 | 11/1995 | Suguro et al. | 437/192 |
| 5,518,959 | 5/1996 | Jang et al. | 437/190 |

FOREIGN PATENT DOCUMENTS

| | | | |
|---|---|---|---|
| 58-4947 | 1/1983 | Japan | 437/195 |
| 59-144151 | 8/1984 | Japan | 437/195 |
| 61-137344 | 6/1986 | Japan . | |
| 2-307221 | 2/1990 | Japan . | |

*Primary Examiner*—Mary Wilczewski
*Attorney, Agent, or Firm*—Oblon, Spivak, McClelland, Maier & Neustadt, P.C.

[57] ABSTRACT

A method of manufacturing a semiconductor device includes the steps of forming a first insulating layer having a hole on a substrate, selectively forming a conductive layer in the hole, selectively forming a second insulating layer on the first insulating layer, patterning the second insulating layer, and forming an interconnection layer in an opening portion of the second insulating layer formed by patterning so as to be electrically connected to the conductive layer.

25 Claims, 15 Drawing Sheets

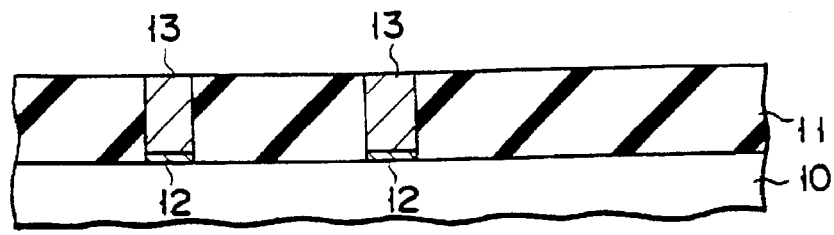
F I G. 3A
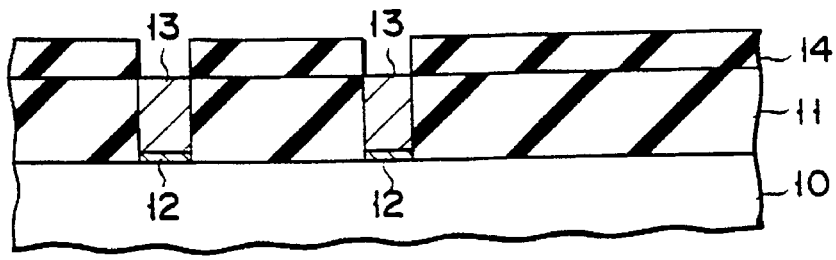
F I G. 3B
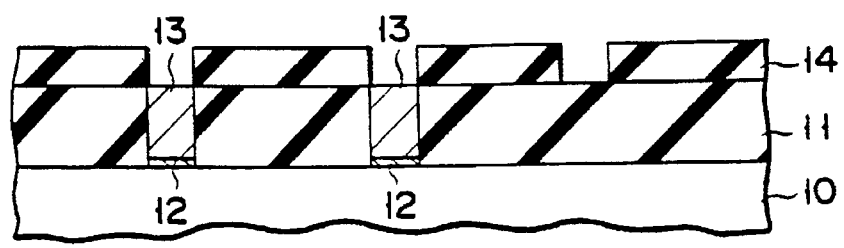
F I G. 3C
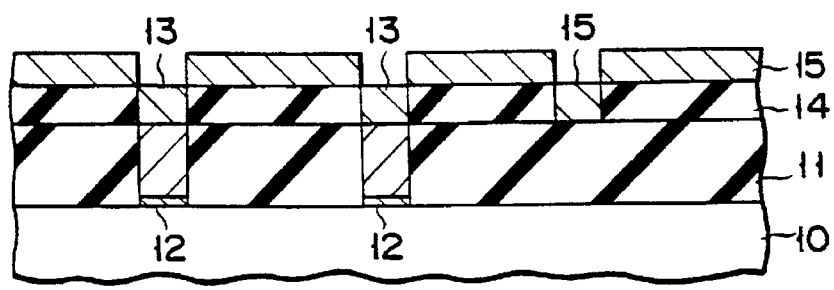
F I G. 3D

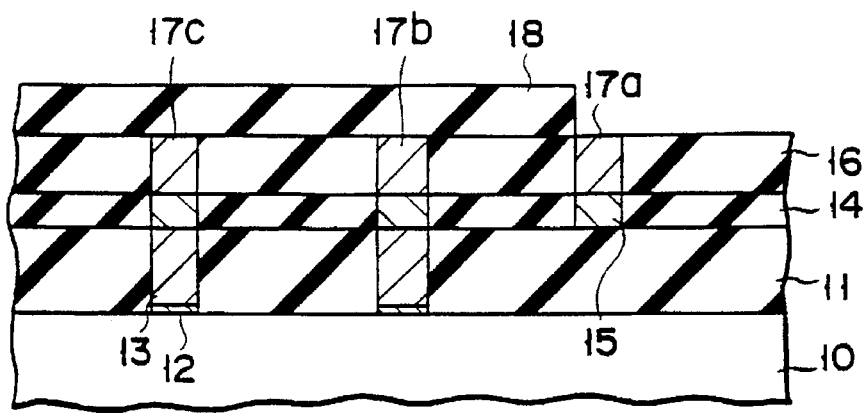
F I G. 3I
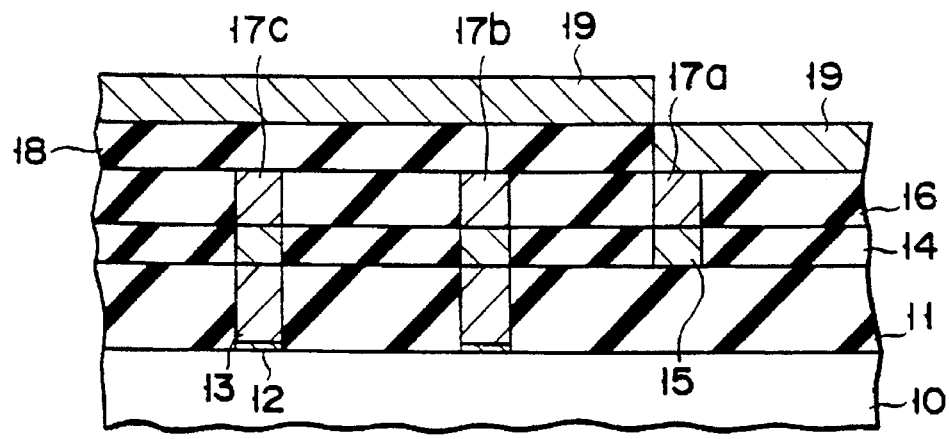
F I G. 3J
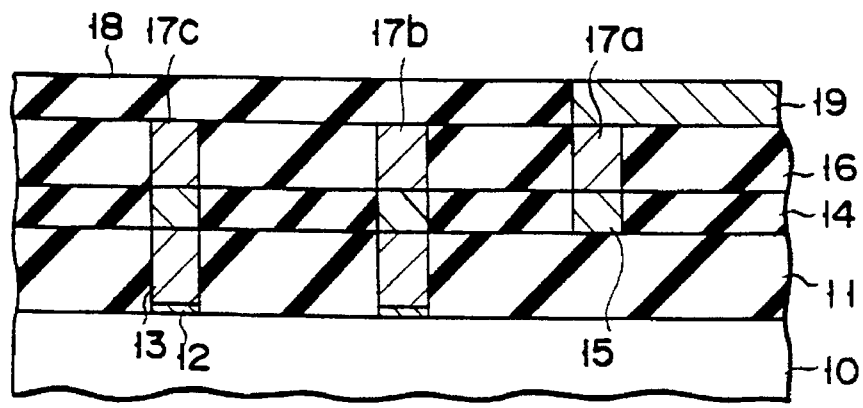
F I G. 3K

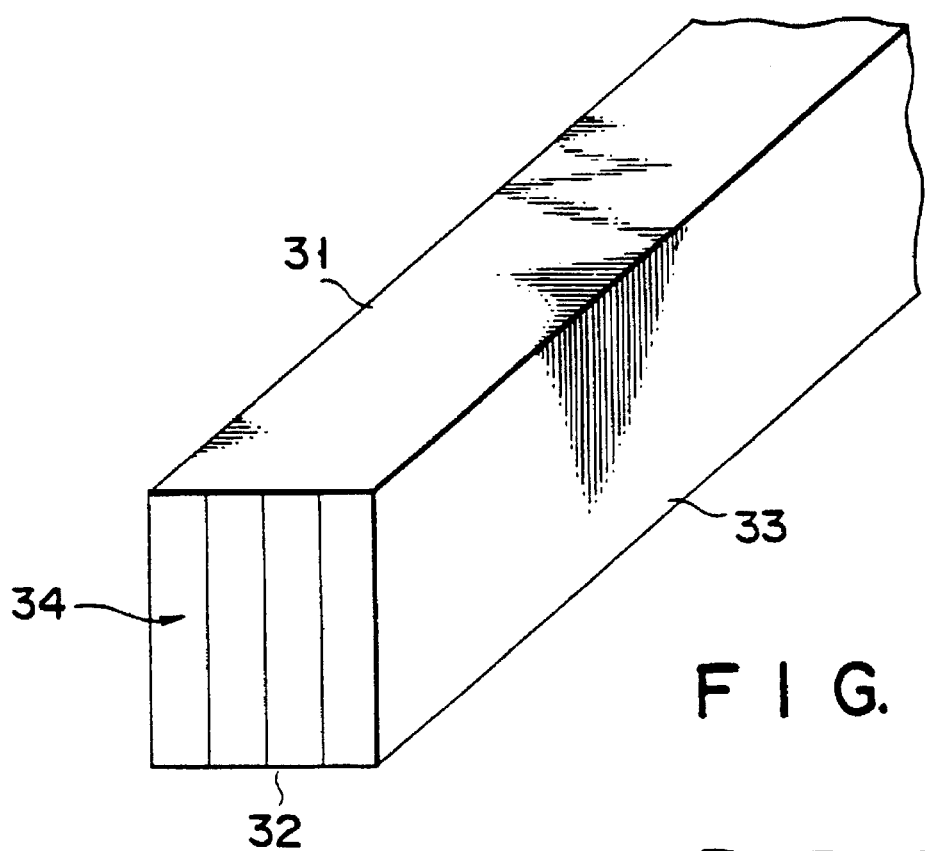
F I G. 4A
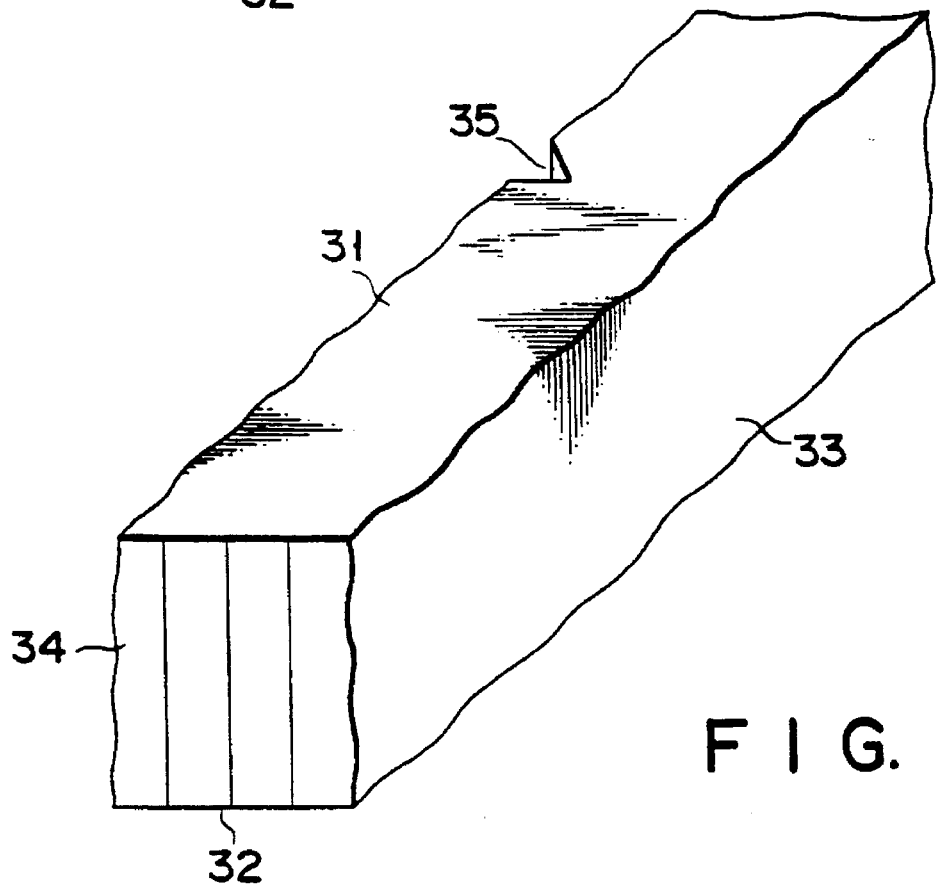
F I G. 4B

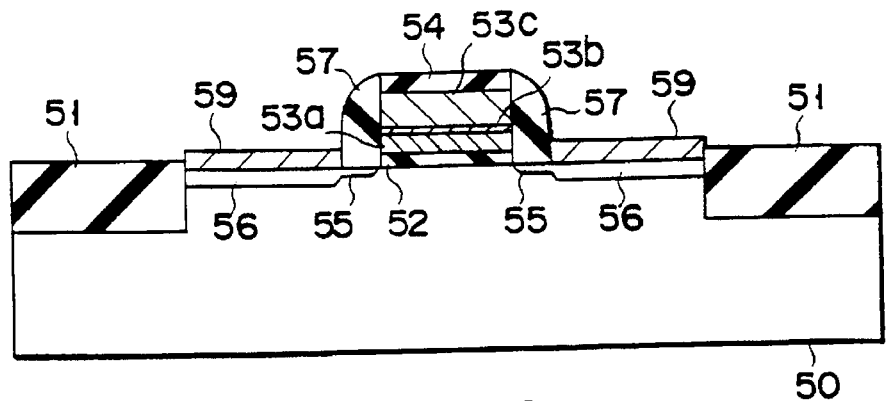
F I G. 6
F I G. 7A
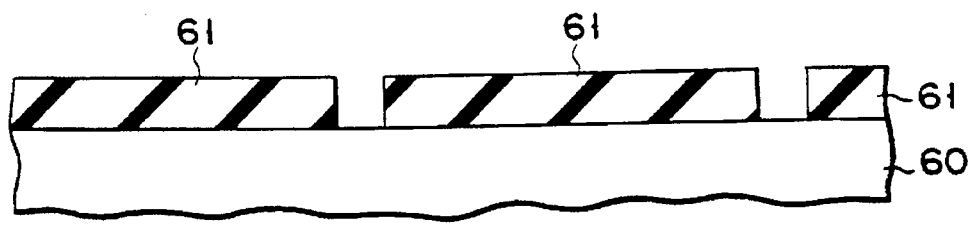
F I G. 7B
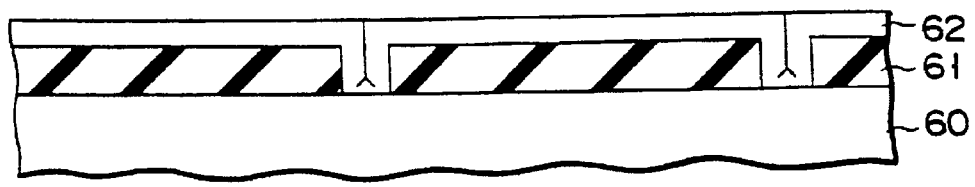
F I G. 7C

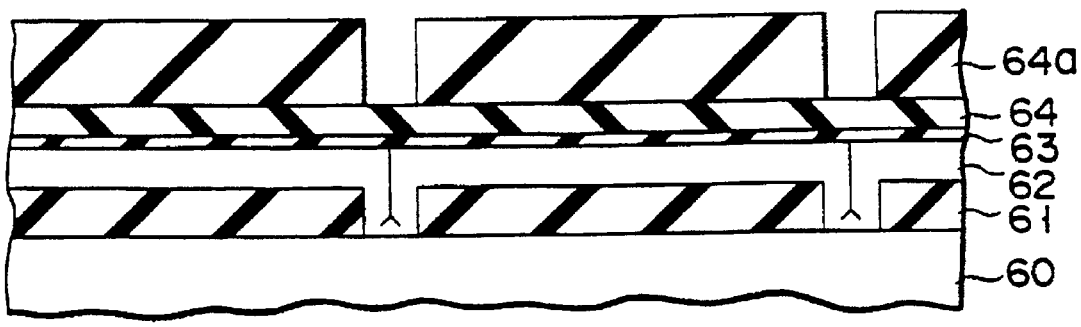
F I G. 7D
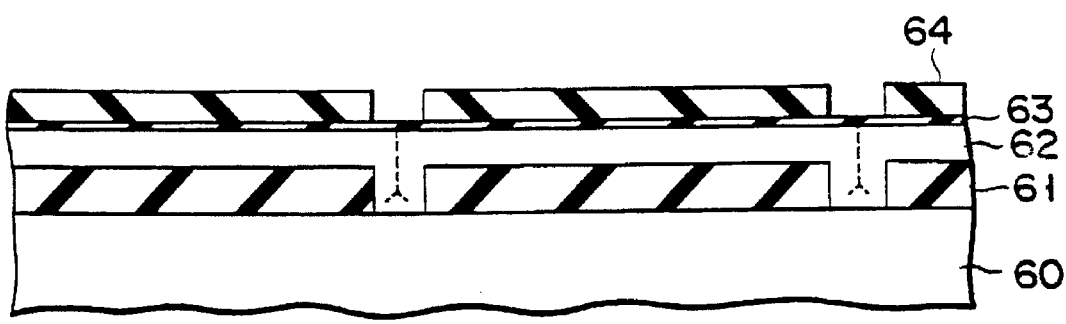
F I G. 7E
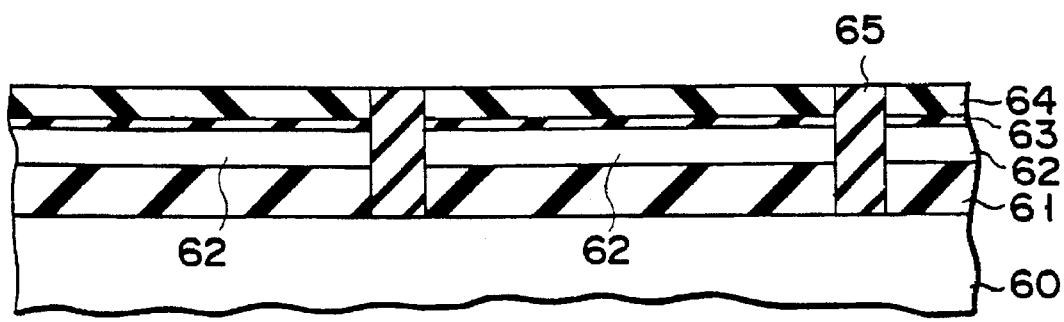
F I G. 7F

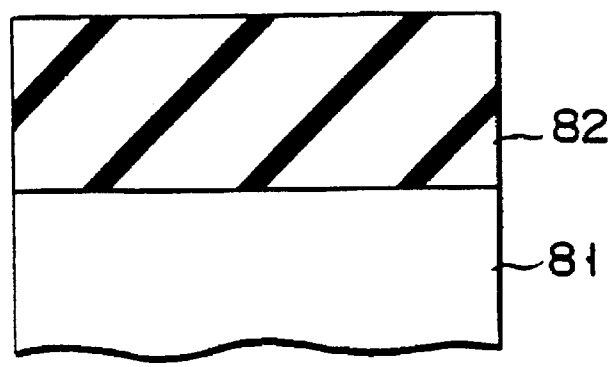
F I G. 8A
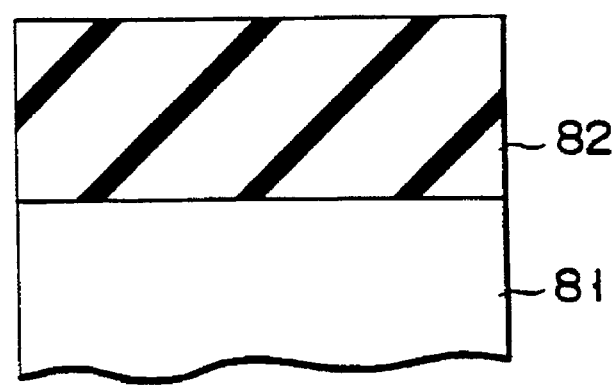
F I G. 8B
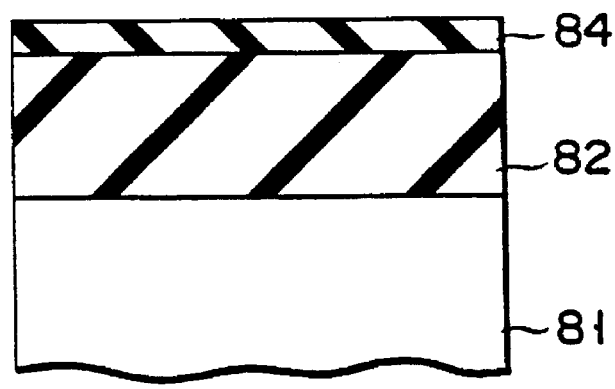
F I G. 8C

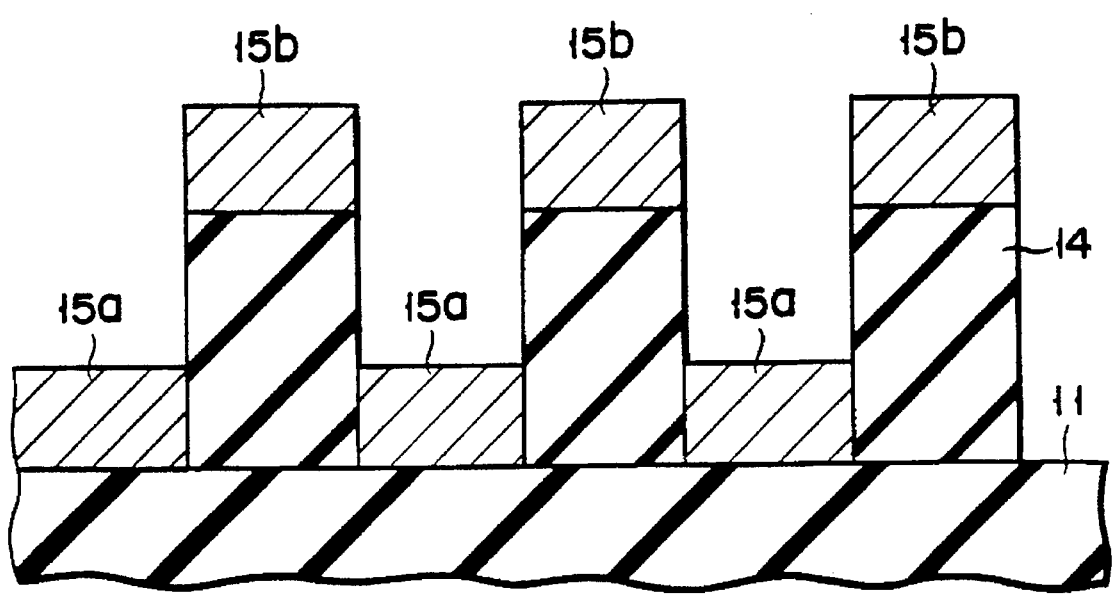
F I G. 10

METHOD OF MANUFACTURING SEMICONDUCTOR DEVICE

This is a Continuation of application Ser. No. 08/385,376 filed on Feb. 7, 1995, now U.S. Pat. No. 5,470,799, which is a Continuation of Ser. No. 07/981,422, filed on Nov. 25, 1992, now abandoned, which is a Division of Ser. No. 07/654,895, filed on Feb. 13, 1991, now U.S. Pat. No. 5,192,714.

BACKGROUND OF THE INVENTION

1. Field of the Invention

The present invention relates to a semiconductor technique for realizing, e.g., a transistor or a multi-layered wiring structure having a size on the order of submicrons and, more particularly, to a semiconductor device using a self-alignment technique and a method of manufacturing the same.

2. Description of the Related Art

In recent years, a large-scale integrated (LSI) circuit formed by integrating a large number of transistors or resistors on a single chip is often used in a main part of a computer or communication equipment. To improve the performance of the LSI is the key to achieving high performance of the entire equipment. For this reason, it is important to improve the performance of a semiconductor device, e.g., a field-effect transistor which constitutes a basic element of the LSI.

In addition, a degree of integration of a memory or logic element has been increased four times every three years, and a design rule has entered a new era of submicrons. Nowadays, mass-production of 4-Mbit dRAMs having a design rule of 0.8 µm and research and development of 0.3- to 0.6-µm rule devices have begun.

In order to form a microelement having a deep submicron size, the following five factors are important.

(1) Lithography technique (2) Oxidizing technique (element isolating technique)

(3) Diffusing technique (formation of source•drain of MOSFET, trench side wall, and emitter•base•collector of bipolar transistor)

(4) Planarizing technique (metal plug formation, insulating film formation, and flattening)

(5) Wiring processing technique (new material, high-selectivity etching)

The above factors will be described in detail below.

(1) Lithography Technique

When a design rule is a size of about 0.2 µm, a required precision is as very strict as 10 to 20 nm which is close to a physical limit of lithography. For example, when satisfactory alignment margins are kept between contact holes and wiring patterns, a space between adjacent wiring patterns is limited by an interval between the contact holes.

When wiring patterns 41, 43, and 46 are formed with alignment margins with respect to contact holes 42, 44, and 45, respectively, as shown in FIG. 5B, a minimum space between adjacent wiring patterns is narrowed at a portion of the contact hole. As a result, a short-circuit easily occurs due to an etching residue. Moreover, narrowing of the space leads to an increase in interwiring capacitance. In addition, the contact holes 44 and 45 must be formed with alignment margins with respect to an element formation region 40 in consideration of a mask misalignment.

If no misalignment occurs, therefore, the widths of the element formation region, the contact hole, and the wiring can be the same, and so the interwiring space is not locally narrowed to effectively reduce the interwiring capacitance. In addition, a space can be reduced in a region where the interwiring capacitance need not be taken into consideration. As a result, a cell size can be decreased to realize element integration at a higher density. No practical manufacturing method, however, has been proposed so far.

(2) Oxidizing Technique (Element Isolating Technique)

As micropatterning of an element progresses, the width of element isolation must be inevitably decreased. In a conventional LOCOS method, as is well known, an oxide film in an isolation region grows by exudation toward an element, and bird's beaks are formed. That is, regardless of the fact that an element region is covered with a nitride film mask, an oxidizing agent exudes under the mask to progress oxidation although an oxidation rate is decreased.

In order to eliminate this drawback, polycrystalline Si may be interposed between the nitride film and a buffer oxide film, thereby reducing the degree of bird's beaks. Although a demand has arisen for a drastic measure, however, no such measure is present, and an oxidation method called directional oxidation is desired.

(3) Diffusing Technique

A microelement having a submicron size, e.g., a micro field-effect transistor (FET) having a submicron size has a shallow diffusion layer such as a source•drain region. In this case, a junction depth required for a 0.5-µm generation device is 0.15 to 0.2 µm, and that required for a 0.2-µm generation device is 0.1 µm or less. That is, a diffusing technique with higher precision is required.

As a method of forming a shallow diffusion layer, a low-acceleration ion-implantation method has been conventionally widely used, and an impurity solid-phase diffusion method is recently used. By this solid-phase diffusion method, a shallow source•drain region having a thickness of about 0.1 µm can be formed, and a depth of about 0.1 µm can be realized for an $n^+$-p junction. In addition, by using a method in which ion implantation of $Si^+$, $Ge^+$, and $Sn^+$ is performed to form a surface layer of an Si single crystal layer into an amorphous layer and then low-acceleration $BF_2$ ion implantation is performed, a depth of about 0.1 µm can be achieved for a $p^+$-n junction even after annealing for activation is performed.

The resistance of a diffusion layer having a thickness of 0.1 µm, however, is as high as a sheet resistance of 100 Ω/□ or more. In order to increase an operation speed of a semiconductor device, therefore, the surface of a diffusion region must be metallized to decrease its resistance. For this reason, a selective silicification method, so-called self-aligned silicide has been examined in recent years.

A conventional example in which a self-aligned silicide is formed on a shallow p-n junction having a depth of 0.2 µm or less will be described below with reference to FIGS. 1A to 1E. Referring to FIG. 1A, a field oxide film 1a and a gate insulating film 2 are formed by thermal oxidation on an Si substrate 1 having (100) crystal orientation, gate electrodes 3a and 3b, an insulating film cap 4, and a side-wall insulating film 5 are formed, and a metal film 6 consisting of Ti or Co is deposited on the entire surface of the substrate. Subsequently, a silicide layer 7 is formed on only Si by lamp annealing, and a non-reacted metal film is removed by etching, thereby selectively leaving the silicide layer 7 on only Si, as shown in FIG. 1B. Subsequently, an impurity 8 having a conductivity type different from that of the substrate 1 is ion-implanted, as shown in FIG. 1C, and a diffusion region 9 is formed under the silicide layer 7, as shown in FIG. 1D. According to this method, by forming the silicide layer 7 having a thickness of, e.g., 50 nm, a sheet resistance can be reduced to be 3 to 5 Ω/□.

This method, however, has the following problems. That is, if a natural oxide film or a surface contamination layer formed by dry etching is present on the Si surface, it is difficult to perform a uniform reaction between a metal and Si, and a nonuniform boundary structure is formed an interface. In this case, electric field concentration locally occurs to increase a p-n junction leakage current, and a p-n junction may be destroyed accordingly. For this reason, it is very difficult to form a p-n junction having a depth of 0.1 μm or less with this method. In addition, a total thickness of 0.1 μm or less is required for a micro transistor having a design rule of 0.3 μm or less. For this reason, the total thickness must be decreased to form a diffusion layer having a thickness of several tens nm. When the thickness of a silicide film is decreased, a resistance of a source•drain is increased, and p-n junction characteristics are degraded if the thickness of a diffusion layer becomes 50 nm or less. The reasons for this junction degradation are as follows. That is, a GR center caused by metal diffusion from a metal compound adversely affects the junction characteristics and enters into a diffusion layer thickness region at which a junction leakage current starts increasing. Also, since the shape of a diffusion layer reflects projections and recesses on the silicide/Si interface when the thickness of the diffusion layer is decreased, electric field concentration easily occurs.

In order to prevent the erosion on the Si substrate upon silicide formation as described above, after an Si film is selectively grown on a source•drain to increase the Si thickness, a normal silicide process may be performed. Since doping cannot be perfectly performed depending on the thickness of selectively grown Si, however, a source•drain impurity diffusion layer does not reach the original substrate surface and therefore cannot serve as a source•drain. In order to form a shallow junction having a depth of 0.1 μm or less, therefore, it is required to form a metal silicide which does not erode the Si substrate and has a low resistance and to form a high-concentration impurity diffusion layer therebelow.

(4) Planarizing Technique

In order to form a multilayered wiring structure, a technique of forming plugs for plugging contact holes or via holes and a technique of forming an $SiO_2$ film having a high step coverage are required because projections and recesses are increased upon stacking wiring layers. In addition, a wiring layer having a low resistance and high reliability must be used.

Current problems of an insulating film formation technique as one important technique of multilayered wiring techniques will be described below. As a method of forming an interlayer insulating film, plasma TEOS-CVD is recently generally used since it has a step coverage higher than that of $SiH_4$-based plasma CVD. When an aspect ratio of an interwiring is 1 or more, however, a deposited shape includes spaces because the step coverage is not 100%. The cause of the low step coverage is as follows. That is, since a reaction gas and a production gas cannot be satisfactorily exchanged in the space portions, the concentration of the reaction gas in a recess portion is reduced as compared with that in a flat portion or a projecting portion. As a result, an $SiO_2$ growth rate is determined not by a reaction rate on the surface but by a reaction gas supply or diffusion rate.

In order to improve the step coverage or the surface shape of the plasma TEOS film, ozone may be added or a temperature range of 300° C. to 350° C. may be selected. These techniques, however, cannot be drastic measures. Therefore, a new oxide film deposition method is required for a device in a deep submicron region.

(5) Wiring Processing Technique

Of the multilayered wiring techniques, various types of metal wiring pattern formation techniques are predicted to have problems in the future. In W wiring processing, for example, it is difficult to perform high-selectivity etching on a gate oxide film. This is because no satisfactory etching rate cannot be obtained by a $Cl_2$-based etching which facilitates high-selectivity etching with $SiO_2$ since a vapor pressure of $WCl_6$ is low. As a result, the selectivity with $SiO_2$ is reduced to be at most 7 to 8. In processing in which 200-nm thick W is to be etched on 5-nm thick $SiO_2$, therefore, if 30% over etching with respect to just etching is performed, the 5-nm thick $SiO_2$ film on a source•drain is completely removed by etching, and the underlying Si substrate is also etched. When an F-based gas such as $SF_6$ gas is used, although high-rate etching can be performed since a vapor pressure of $WF_6$ as a fluoride of W is very high, it is difficult to increase the selectivity with respect to $SiO_2$ to be 7 or more. Therefore, it is very difficult to form a micro wiring pattern of W.

It is far more difficult to perform etching for Cu (1.68 μΩ·cm) having a lower resistance than that of Al (2.5 to 3 μΩ·cm). For example, even Cu chloride having a highest vapor pressure does not evaporate until a temperature is heated up to about 300° C. to 350° C. This high-temperature etching brings about the following two problems. First, since only few Cu etching masks can withstand such a high-temperature $Cl_2(BCl_3)$ atmosphere, a new mask must be developed. Second, if a low-temperature portion is exposed in an etching chamber, Cu chloride evaporated from a wafer is condensed to serve as a generation source of particles. Therefore, a metal wiring pattern formation technique requiring no metal patterning must be developed.

As described above, as long as the conventional process techniques are adopted, it is very difficult to form various types of patterns free from exudation such as an element isolation region, e.g., a series of micropatterns such as a shallow p-n junction region, a silicided region of a source-drain, metal and metal/polySi gates, low-resistance wiring, and multilayered wiring. In addition, in order to form a pattern free from exudation, a mask alignment precision beyond a physical limit is required in lithography. If high-precision processing is required in etching, therefore, a degree of freedom of selection for materials is significantly decreased.

SUMMARY OF THE INVENTION

The present invention has been made in consideration of the above situation and has as its object to provide a method of manufacturing a semiconductor device, capable of forming a wiring layer or an insulating film by using a self-aligned process without depending on a mask alignment or metal etching technique, thereby manufacturing a semiconductor device having a micropattern free from exudation.

In order to achieve the above object of the present invention, the present inventors have found that a micropattern such as wiring can be formed with high precision by using selective or anisotropic (directional) process techniques such as anisotropic (directional) oxidation of Si, anisotropic (directional) diffusion of an impurity, selective growth of a metal silicide, anisotropic (directional) selective growth of a metal film and a polycrystalline Si film, and anisotropic (directional) selective growth of an insulating film.

According to the present invention, there is provided a method of manufacturing a semiconductor device, comprising the steps of forming a first insulating layer having a hole on a substrate, selectively forming a conductive layer in the hole, selectively forming a second insulating layer on the first insulating layer, patterning the second insulating layer, and forming an interconnection layer in an opening portion of the second insulating layer formed by patterning so as to be electrically connected to the conductive layer.

In addition, according to the present invention, there is provided a method of manufacturing a semiconductor device, comprising the steps of forming a first insulating layer having a plurality of holes on a substrate, selectively forming conductive layers in the holes, oxidizing a surface of a conductive layer of the conductive layers except for a conductive layer on which an interconnection layer is to be formed, selectively forming a second insulating layer on the first insulating layer and the conductive layer having the oxidized surface, patterning the second insulating layer, and forming an interconnection layer in an opening portion of the second insulating layer formed by patterning so as to be electrically connected to the conductive layer having a non-oxidized surface.

Furthermore, according to the present invention, there is provided a semiconductor device comprising a substrate, a first insulating layer having a hole and formed on the substrate, a conductive layer selectively formed in the hole, a second insulating layer selectively formed on the first insulating layer, and an interconnection layer formed to be self-aligned in the hole of the second insulating layer and electrically connected to the conductive layer, a width of a portion of the interconnection layer to be connected to the conductive layer being the same as a size of the conductive layer.

BRIEF DESCRIPTION OF THE DRAWINGS

FIGS. 3A to 3K are sectional views showing manufacturing steps of the device shown in FIG. 2;

FIGS. 4A and 4B are perspective views showing wiring pattern shapes;

FIG. 6 is a schematic sectional view showing a MOSFET according to the second embodiment of the present invention;

FIGS. 8A to 8C are sectional views showing $SiO_2$ surface crystallization steps for explaining the fourth embodiment of the present invention;

FIG. 10 is a sectional view showing a multilayered wiring structure according to another embodiment of the present invention.

DETAILED DESCRIPTION OF THE PREFERRED EMBODIMENTS

Preferred embodiments of the present invention will be described below with reference to the accompanying drawings.

Figure 1A:
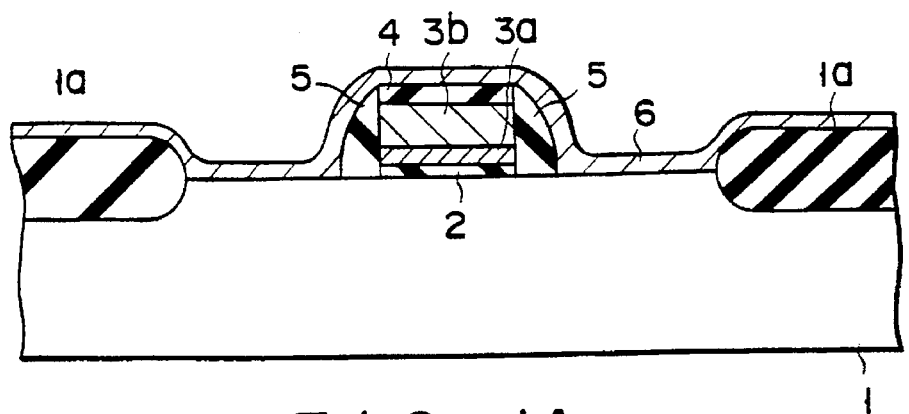
FIGS. 1A to 1D are sectional views showing conventional MOSFET manufacturing steps.
Figure 1B:
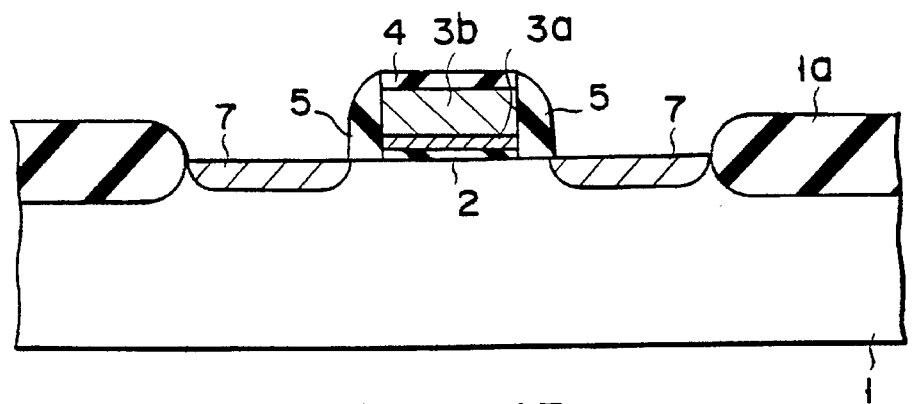
Figure 1C:
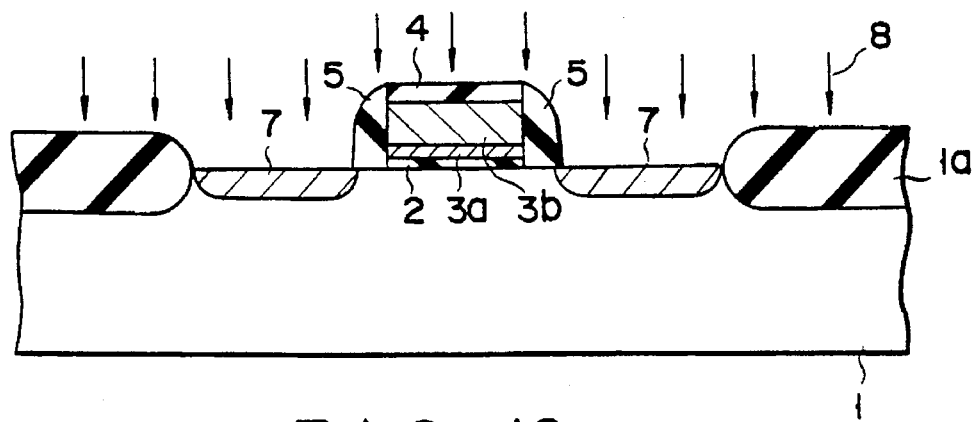
Figure 1D:
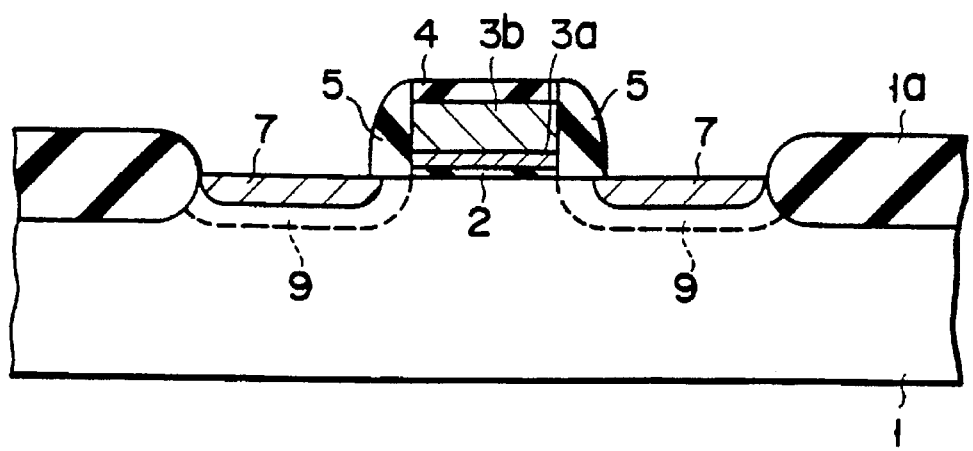
Figure 2:
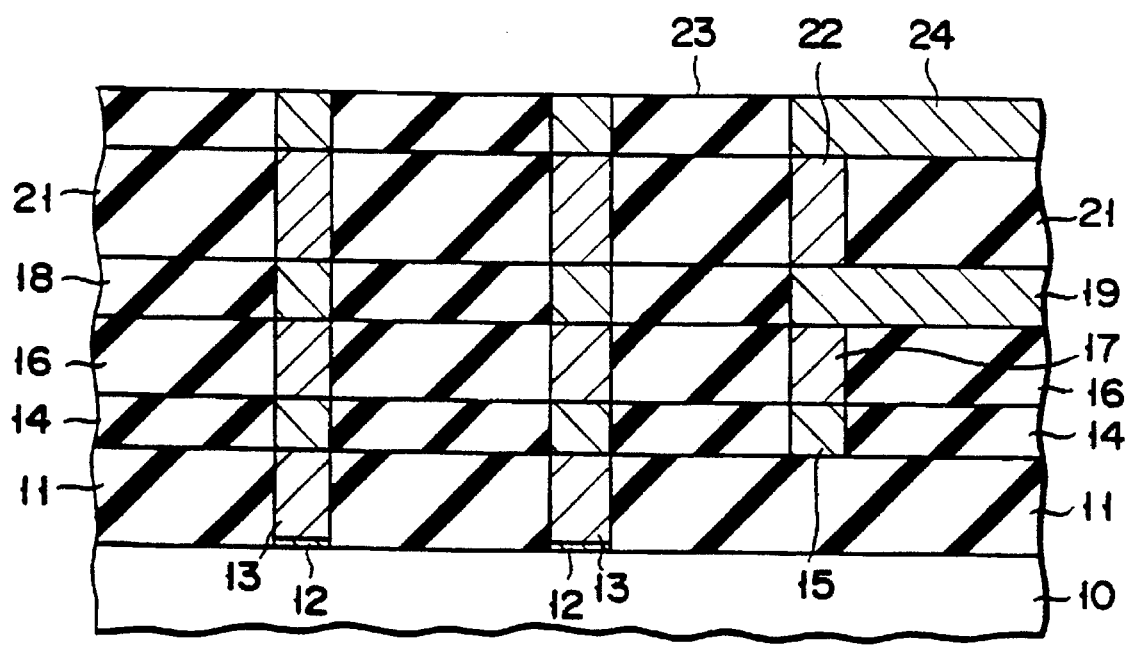
FIG. 2 is a schematic sectional view showing an arrangement of a semiconductor device (multilayered wiring structure) according to the first embodiment of the present invention.

FIG. 2 is a schematic sectional view showing an arrangement of a semiconductor device (multilayered wiring structure) according to the first embodiment of the present invention. Referring to FIG. 2, metal silicide layers 12 which do not erode Si are formed in opening portions of a first insulating film 11 formed on a semiconductor substrate 10, and a first metal burying vertical wiring layer 13 is formed on each layer 12. A second insulating film 14 is formed on the resultant structure, and Cu wiring layers 15 having a low resistance, for example, are formed in opening portions of the film 14. A third insulating film 16 is formed on the resultant structure, and a second metal burying vertical wiring layer 17 is formed in an opening portion of the insulating film 16. A fourth insulating film 18 is formed on the resultant structure, and a second low-resistance wiring layer 19 is formed on a portion from which the insulating film 18 is removed.

Similar to the layers 16 to 19, a fifth insulating film 21, a third metal burying vertical wiring layer a sixth insulating film 23, and a third low-resistance wiring layer 24 are formed on the above structure, thereby completing a three-layered wiring structure. A 5- or 10-layered wiring structure can be formed by repeatedly forming this structure.

A multilayered wiring structure can be also formed by the following process as shown in FIG. 10.

FIG. 10 shows self-aligned two-layer wiring structure formed by using an anisotropic film formation techniques. First of all, an insulating layer 14 having grooves, in which a wiring is to be formed, is formed, and metal such as Al, Cu/TiN, Cu/Nb and the like is deposited by an anisotropic CVD method to form a first low resistance wiring layer 15a, and a second low resistance wiring layer 15b. This wiring structure is advantageous in that the first and second low resistance wiring layers are formed in self-alignment, and thus a distance between the wiring layers can be determined by the thickness of the insulating layer 14. The wiring layers do not overlap to decrease a wiring capacitance between the wiring layers. A contact between the second wiring layer 15b and a substrate (not shown) is made by forming an opening in part of the second wiring layer 15b and the portion of the insulating layer 14 below the second wiring layer 15b to expose the upper surface of a contact plug buried in the insulating layer 11, and burying another contact plug in the opening by a selective CVD method. That is, an insulating film is formed on the entire surface of the structure, the opening is formed in the insulating film, the second insulating layer 15b and the insulating layer 14, and the contact plug is buried in the opening.

According to the above-mentioned method, two-layered wiring patterns can be formed by only one lithography process, and thus lithography step can be shortened. Further, when a step wise insulating film is formed, it is possible to form three or more-layered wiring patterns can be formed at the same time.

FIGS. 3A to 3K are sectional views showing manufacturing steps of the above multilayered wiring structure.

As shown in FIG. 3A, the first insulating film 11 is formed on the semiconductor substrate 10 having an element therein, and contact portions of the film 11 are opened. The metal silicide layer 12 is formed in each opening portion by a selective CVD method, and the first metal burying vertical wiring layer 13 consisting of, e.g., W or Cu is formed thereon by the selective CVD method. Subsequently, as shown in FIG. 3B, the $SiO_2$ film (second insulating film) 14 is formed on only the insulating film 11. Thereafter, as shown in FIG. 3C, windows are formed by lithography and etching in portions of the insulating film 14 requiring wiring.

Figure 3E:
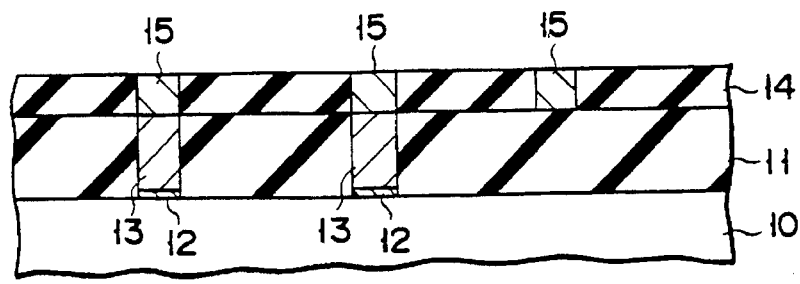
Figure 3F:
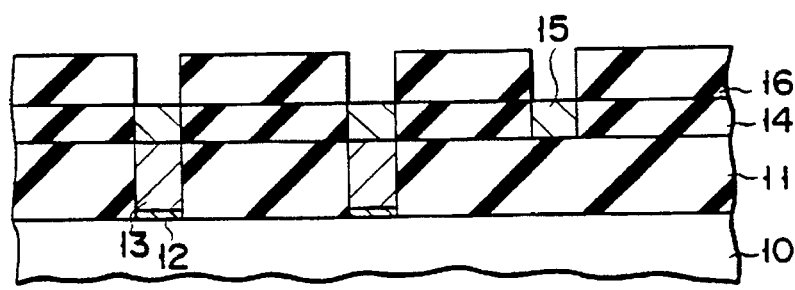
Figure 3G:
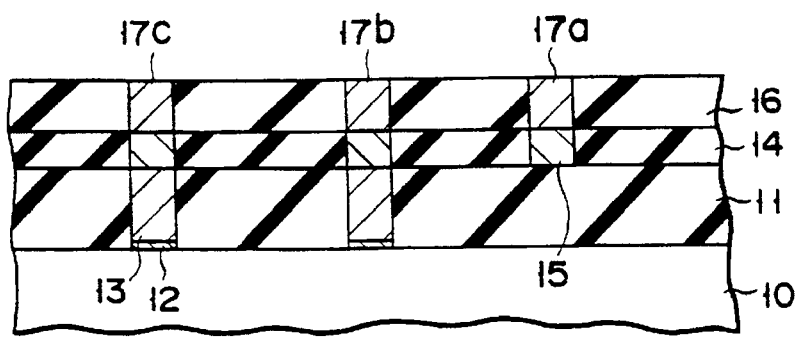

Subsequently, as shown in FIG. 3D, the first low-resistance wiring layer 15 such as a stacked structure of a barrier metal (e.g., TiN) and Cu is formed on the entire surface by an anisotropic CVD method using ions of metal atoms or molecules constituting the wiring. Subsequently, as shown in FIG. 3E, an unnecessary portion of the wiring layer 15 is removed by an etching-back method (a mirror-surface polishing method, reactive ion etching using a flattening agent such as a resist) or a lift-off method, thereby leaving the wiring in only a desired portion. As shown in FIG. 3F, the $SiO_2$ film (third insulating film) 16 is selectively formed on only the insulating film 14 by the selective CVD method. Subsequently, as shown in FIG. 3G, metal burying wiring layers 17a, 17b, and 17c consisting of W or Cu are formed by the selective CVD method. Thereafter, that surface of the metal burying wiring layers on which $SiO_2$ is to be deposited, i.e., the surfaces of the wiring layers 17b and 17c are oxidized by a thickness of 10 to 20 nm. This oxidation may be performed by scanning an oxygen ion beam, ion-implanting oxygen. Alternatively, oxidation may be performed by oxidizing using a mask which withstands oxidation.

Figure 3H:
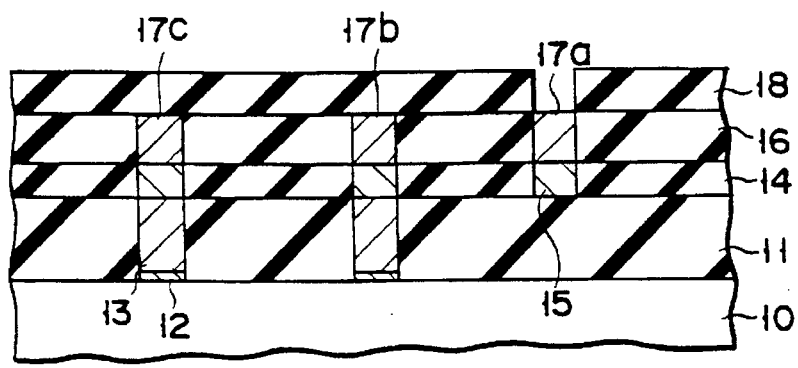

Thereafter, as shown in FIG. 3H, the $SiO_2$ film (fourth insulating film) 18 is selectively grown on only the insulating film 16 by the selective CVD method. Subsequently, as shown in FIG. 3I, an unnecessary portion of the insulating film 18 is removed by lithography and etching. Thereafter, as shown in FIG. 3J, the second low-resistance wiring layer 19 consisting of, e.g., Cu is formed by the anisotropic or directional CVD method. As shown in FIG. 3K, the wiring is left in only a desired portion by etching or lift-off as in the step shown in FIG. 3E.

Thereafter, formation steps of the layers 21 to 24 shown in FIG. 2 can be similarly performed as those of the layers 16 to 19. In addition, the anisotropic CVD method can be replaced by the selective CVD method depending on the shape of a pattern.

FIG. 4A shows the shape of a 0.1-μm wide wiring pattern obtained when the wiring is formed in an opening portion having a guide of an insulating film by the anisotropic or selective CVD method. Referring to FIG. 4A, not only an upper surface 31 and a lower surface 32 but also a side surface 33 of the wiring are flat because they are covered with the insulating film. FIG. 4B shows a 0.1-μm wide pattern shape formed by electron beam photolithography and metal RIE or ion milling. Referring to FIG. 4B, a side surface 33 is not flat but has undulations of 0.01 to 0.03 μm due to nonuniformity of etching. In addition, a notch as indicated by reference numeral 35 is easily formed. The wiring pattern buried in an opening portion of an insulating film has a shape flatter than that of the wiring pattern formed by etching because the insulating film can be etched better than a metal.

Figure 5A:
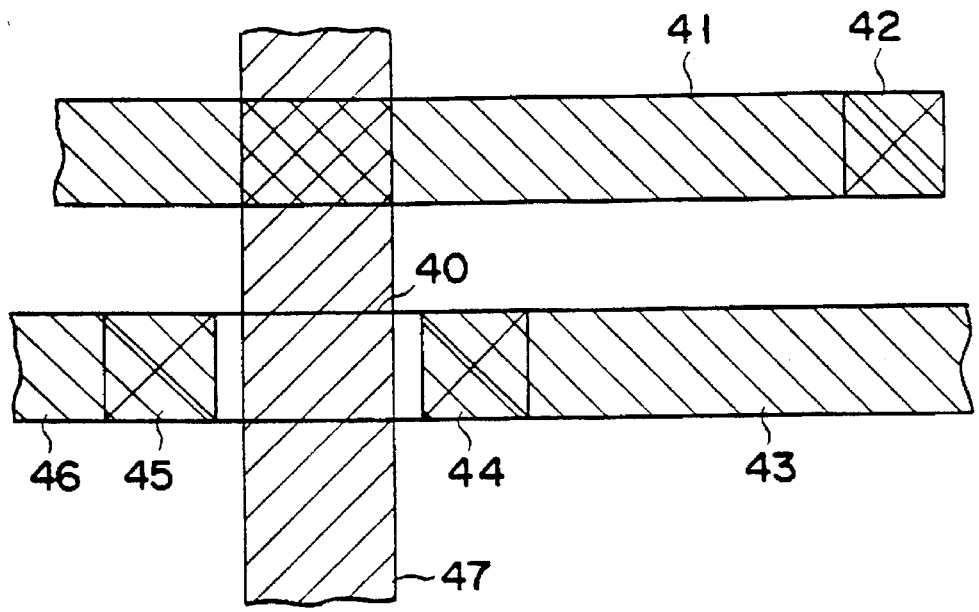
FIGS. 5A and 5B are plan views each showing a wiring shape on an element formation region.
Figure 5B:
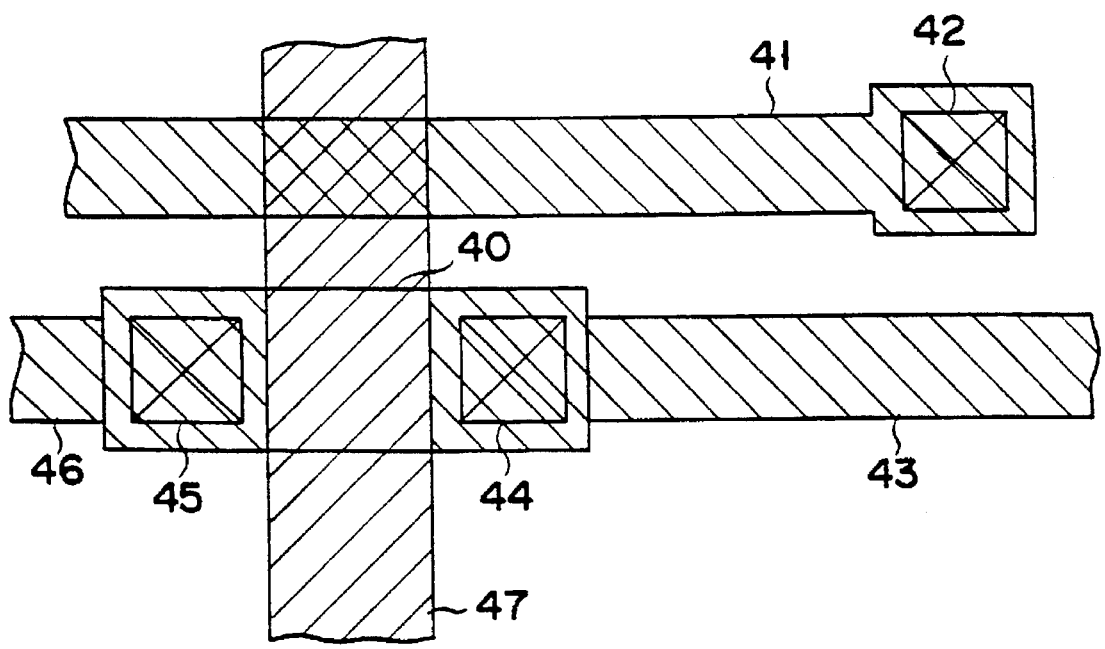

FIG. 5A shows a structure in which wiring is formed on an element formation region by using a self-aligned process. Unlike in a structure shown in FIG. 5B, since no alignment margin is required in portions of contact holes 42, 44, and 45, a wiring width is not locally increased. For this reason, since an interwiring space is widened and an interwiring capacitance is reduced, a wiring delay time is effectively shortened and an interwiring crosstalk can be suppressed. If these effects need not be taken into consideration, the interwiring space can be narrowed to realize a large wiring width. As a result, since a wiring resistance is decreased to suppress degradation in reliability caused by micropatterning such as stress migration, a high performance and a high density are realized.

FIG. 6 is a sectional view for explaining the second embodiment of the present invention, in which a MOSFET formed by selectively depositing a metal silicide on an Si substrate without eroding Si is illustrated. In order to manufacture this MOSFET, an element isolation insulating film 51 and a gate oxide film 52 are formed on a semiconductor substrate 50, and a gate electrode 53 constituted by a polycrystalline Si layer 53a, a TiN layer 53b, and a W or Cu layer 53c, and a cap insulating film 54 are formed thereon. Subsequently, an impurity diffusion region 55 having a thickness of 50 nm or less is formed, a side wall insulating film 57 is formed, and a metal silicide layer 59 is selectively formed on Si. Thereafter, a high-concentration impurity diffusion region 56 is formed.

In the MOSFET having the above structure, the element isolation insulating film 51 and the diffusion regions 55 and 56 are formed without two-dimensional exudation of the pattern and the metal silicide layer 59 is formed without eroding the Si substrate. Therefore, a very shallow $p^+$-n or $n^+$-p junction can be formed. Oxidation of the diffusion regions and the element isolation region is realized by applying heat and a bias to the substrate by using a dopant impurity ion or oxidation seed ion having a low energy of about 1 to 100 eV.

The third embodiment in which the present invention is applied to the manufacture of a CMOS transistor will be described below.

As shown in FIG. 7A, a 300-nm thick $SiO_2$ film 61 is formed on an Si (100) p-type 5- to 10-Ω·cm substrate 60. Subsequently, as shown in FIG. 7B, a seed opening portion is formed, and a natural oxide film formed on an Si-exposed surface in the opening portion is removed by wet or dry processing. At the same time, the Si surface is H-bonded in order to obtain a high quality film, and a 100-nm thick amorphous Si film 62 having a high step coverage is formed by an LPCVD method using $SiH_4$, as shown in FIG. 7C. Upon formation of the amorphous Si film, the temperature is set between 500° C. to 550° C. so that the density of the film is maximized. Under this condition, epitaxial growth can occur in the seed portion. In order to obtain lateral growth on $SiO_2$, a heat treatment is performed in an Ar atmosphere of 2 ppb or less at a temperature of 500° C. to 550° C. for eight hours. Thereafter, high-temperature annealing is performed at 900° C. to 1,000° C. to obtain a high density.

Subsequently, as shown in FIG. 7D, a 10-nm thick $SiO_2$ film 63, and a 90-nm thick $Si_3N_4$ film 64 are formed by the LPCVD method, and a resist pattern 64a is formed. In this formation, mask alignment does not require high alignment precision. FIG. 7E shows a structure in which the $Si_3N_4$ film 64 is etched and the resist is removed by RIE. Thereafter, phosphorus and boron are doped in a p-ch transistor formation region and an n-ch transistor formation region, respectively, at a concentration of $10^{17}$ $cm^{-3}$ by field ion implantation.

Subsequently, the substrate temperature is set at 900° C., the substrate bias is set at +50 V, and a mixed ion beam (1 to 100 eV) of $O_2^-$ or $H_2O^-$ and $O^-$ or $O_2^-$ is radiated to perform anisotropic oxidation, thereby forming an $SiO_2$ film 65, as shown in FIG. 7F. When an alkali metal (e.g., Rb, Cs, Li or the like) is evaporated in an extraction portion of an oxygen plasma, the alkali metal gives electrons to oxygen because the alkali metal easily forms positive ions, and $O_1^-$, $O_2^-$ and $H_2O^-$ ions are increased. When a gas such as F which forms negative ions more easily than oxygen is evaporated in the oxygen plasma extraction portion, the gas accepts electrons from oxygen, and $O^+$, $O_2^+$ and $H_2O^+$ ions are increased. Therefore, a mixed ion beam of positively charged $H_2O^+$ and $O^+$ or $O_2^+$ may be used to apply a negative bias to the substrate. In this embodiment, $SiO_2$ film 65 is formed by an anisotropic oxidation to form an element isolation. An anisotropic nitridation may be performed to form an element isolation. That is, a gas such as $NH_3$ is introduced and the gas molecules are positively or negatively charged. Then, the substrate is biased. Thus, a silicon nitride film can be anisotropically formed. Thereafter, phosphorus and boron are doped in a p-ch region 62a and an n-ch region 62b, respectively, at a concentration of $10^{17}$ $cm^{-3}$ by channel ion implantation. In this case, anisotropic doping can be similarly performed by applying a positive or negative bias to the substrate, and the impurities can be diffused vertically in the substrate prior to other directions.

Figure 7G:
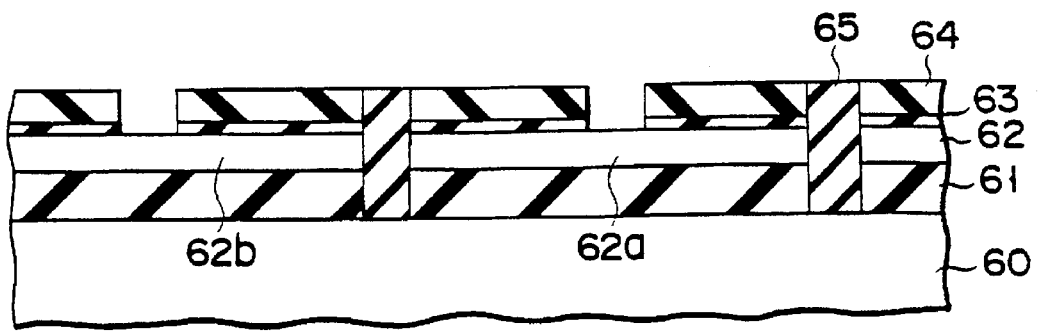
FIGS. 7A to 7N are sectional views showing CMOS transistor manufacturing steps for explaining the third embodiment of the present invention.
Figure 7H:
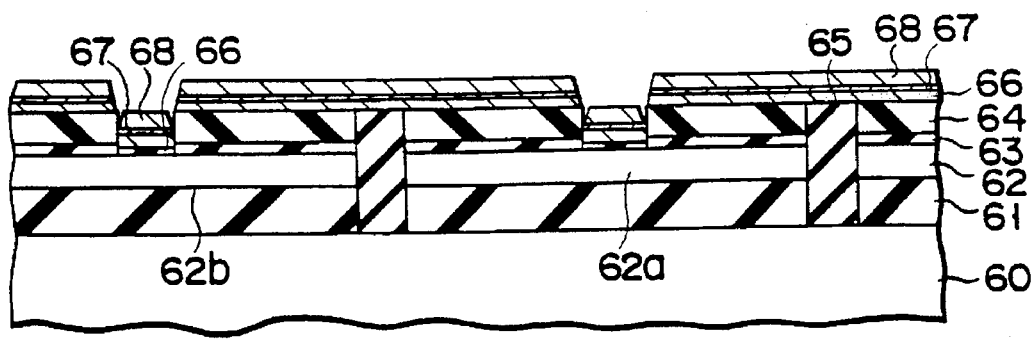

As shown in FIG. 7G, a resist mask (not shown) having a complementary pattern of a gate electrode is used to remove the Si nitride film 64 in a gate electrode formation region. Subsequently, as shown in FIG. 7H, a 50-nm thick amorphous or polycrystalline Si (phosphorus concentration= $1\times10^{20}$ $cm^{-3}$) film 66, a 10-nm thick TiN film 67, and a 100-nm thick w film 68 are formed by anisotropic CVD. In this case, anisotropic CVD conditions are as follows.

(1) Amorphous or polycrystalline Si (phosphorus concentration: $1\times10^{20}$ $cm^{-3}$) film 66
   Pressure: 2 to $4\times10^{-4}$ Torr
   Temperature: 100° to 200° C.
   Substrate bias: –60 to –80 V
   Gases used:
      A gas mixture of $SiH_4$ (30 SCCM) and $PH_3$ (5 to 10 SCCM)
(2) TiN film 67
   Pressure: 2 to $4\times10^{-4}$ Torr
   Temperature: 250° C.
   Substrate bias: –60 to –80 V
   Gas used:
      $Ti[N(C_2H_5)]_4$ (supplied by 10-SCCM $N_2$ through a bubbler at 90° C.); or
      A gas mixture of $TiCl_4$ (3 to 5 SCCM), $N_2$ (5 to 10 SCCM) and $H_2$ (10 to 20 SCCM) $TiCl_4$ is heated to 80° to 90° C.
(3) W film 68
   Pressure: 2 to $4\times10^{-4}$ Torr
   Temperature: room temperature to 100° C.
   Substrate bias: –60 to –80 V
   Gases used:
      A gas mixture of $WF_6$ (10 SCCM) and $H_2$ (30 to 40 SCCM)

Under these conditions, a charge space in which electrons and ions are present at the same time is formed.

In order to realize a low power source voltage, polycrystalline Si is formed undoped (without doping an impurity), and boron and phosphorus or arsenic are doped in the p-ch region and the n-ch region, respectively, at a concentration of $10^{17}$ $cm^{-3}$. Doping may be performed by an ion beam such as $B^+$, $As^+$, or $P^+$ having 10 to 100 eV or vapor-phase diffusion by using a mask such as a resist or by ion beam direct delineation without using a mask.

Figure 7I:
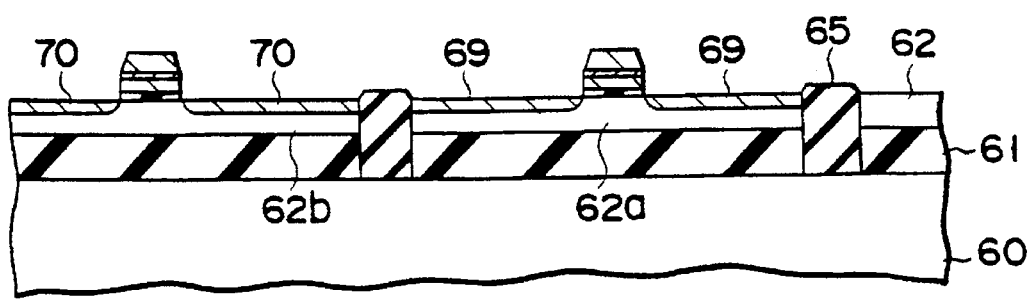

The Si nitride film 64 is removed by dry etching. The etching of the Si nitride film 64 may be performed by wet etching by using, e.g., a phosphoric acid-based mixed acid. In this case, the polycrystalline Si, TiN, and W films are simultaneously lifted off, as shown in FIG. 7I. Referring to FIG. 7I, a high-concentration boron diffusion region 69 ($10^{18}$ to $10^{19}$ $cm^{-3}$) having a thickness of 20 to 30 nm is formed on the p-ch region, and a high-concentration arsenic diffusion region 70 ($10^{18}$ to $10^{19}$ $cm^{-3}$) having a thickness of 20 to 30 nm is formed on the n-ch region. Also in this case, doping is performed by using anisotropic diffusion as described above.

Figure 7J:
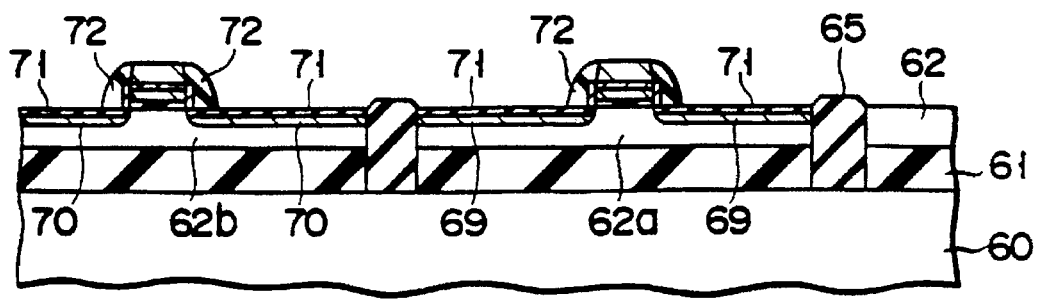

Post-oxidation is performed in dry oxygen at 800° C. for 20 to 30 minutes to form an $SiO_2$ film 71, as shown in FIG. 7J. In this case, when the oxidation is performed in an atmosphere in which an $H_2/H_2O$ gas mixture is diluted by nitrogen so as not to oxidize W, TiN is not decomposed and W is not oxidized.

Subsequently, a 60-nm thick Si nitride film is formed by LPCVD, and an Si nitride film ($Si_3N_4$) 72 is left on only the gate side wall by etching-back.

Figure 7K:
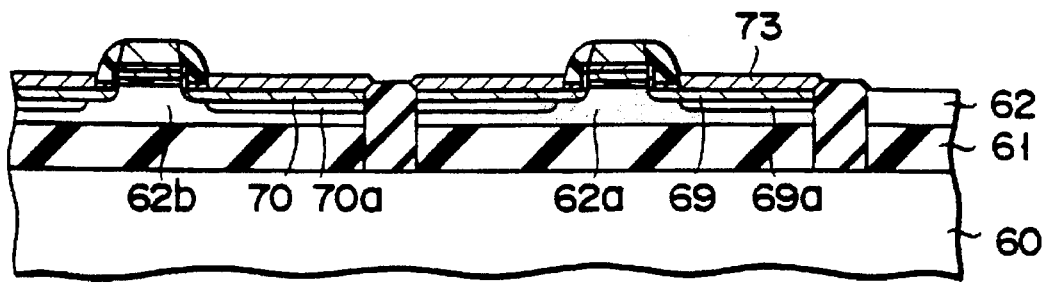

As shown in FIG. 7K, the $SiO_2$ film 71 on the source and drain regions are removed, and a 100-nm thick metal silicide layer 73 is formed by selective growth. As the metal silicide, an Ni silicide (NiSi or $NiSi_2$), $TiSi_2$, or $CoSi_2$ can be selectively grown. In this selective growth, it is very important to clean the surface of the Si substrate. Immediately before the selective growth is performed, therefore, $SiO_2$ of the natural oxide film must be removed by $SF_6/H_2O$- or $NF_3/H_2O$-based dry etching.

A chamber (pre-chamber) for cleaning the surface of the Si substrate is provided immediately before the silicide film deposition chamber, and $SF_6/H_2O$ is supplied to the pre-chamber at a partial pressure ratio of 1 and a total pressure of 0.1 to 10 Torr. A plasma discharge is generated by using a 2.4-GHz microwave and to a position above the semiconductor substrate separated from a discharge portion. In this plasma etching, $SiO_2$ on the semiconductor substrate can be selectively etched. An etching rate was 5 nm/min. The substrate is conveyed to a silicide CVD chamber. Gases used in silicide selective growth are a source gas of Si, a metal source gas, and a carrier gas.

Examples of the Si source gas are $SiH_4$, $Si_2H_6$, $Si_3H_8$, and $SiCl_4$. Examples of the metal source gas of Ni are $Ni(CO)_4$, $NiF_2$, $NiBr_2$, and $NiCl_2$. Examples of the metal source gas of Co are $Co(Co)_4$, $CoF_2$, $CoBr_2$, and $CoCl_2$. Examples of the metal gas of Ti are $TiCl_4$, $TiBr_4$, and $TiF_4$. Although a carbonyl-based gas has a high vapor pressure, it must be carefully handled because it has high toxicity. As a halide-based gas has a low vapor pressure, it must be heated by a heater so as not to be solidified in a piping and a chamber. In this embodiment, $Co_2(CO)_8$ or $Ni_2(CO)_8$ (0.01 to 10 SCCM) and $SiH_4$ (0.1 to 10 SCCM) were used as source gases, and Ar (10 to 100 SCCM) was used as a carrier gas. In addition, $H_2$ (10 to 100 SCCM) was used as a dilution gas. The substrate temperature was 200° C. to 400° C., and the total pressure was 1 to 100 Pa. Under these conditions, a deposition rate of $CoSi_2$ or $NiSi_2$ was about 10 nm/min. A thickness to be deposited was 100 to 200 nm. Sheet resistances obtained after annealing at 700° C. to 800° C. were 0.75 to 1.5 $\Omega/\square$ and 1.8 to 3.5 $\Omega/\square$.

Thereafter, boron and phosphorus or arsenic are doped in the silicide of the p-ch region and the silicide of the n-ch region, respectively, and at the same time an energy beam such as a laser beam or an electron beam is radiated or lamp heating is performed to diffuse an impurity in the Si substrate at a concentration of $10^{20}$ to $10^{21}$ $cm^{-3}$, thereby forming a $p^+$-type diffusion region 69a and an $n^+$-type diffusion region 70a. Doping may be performed by an ion beam or vapor-phase diffusion by using a mask or by ion beam direct delineation without using a mask.

Subsequently, a 1-μm thick insulating film 74 is deposed by CVD, opening portions are formed, and a W plug 75 is selectively grown in each opening portion. The W plug 75 can be selectively grown by the LPCVD method performed by using $WF_6$, $H_2$, and $SiH_4$ at a total pressure of 0.1 to 10 Torr. In a structure in which contact holes having different depths are present in an underlying layer, if deep portions are perfectly buried to be flattened, shallow portions overflow from the contact holes by over filling. In this case, therefore, a gas mixture consisting of a gas containing F such as $CF_4$, $NF_3$, or $SF_6$ and $O_2$ is used to form a plasma, and a substrate is set in a position separated from the plasma. Thereafter, $O_2$ is excessively supplied or dilution by $N_2$, Ar, or the like is performed so that the etching rate of W is determined by a reaction gas supply rate, thereby etching W at a pressure of 0.3 to 10 Torr. As a result, the over-filled W portion having a large solid angle with respect to the reaction gas is etched at high speed and the surface is smoothened. Thereafter, a nitride film having a thickness of about 5 nm is formed on the surface of the W plug 75 in an $N_2$ plasma by using 500-W RF.

Subsequently, an insulating film 76 is selectively grown on the insulating film 74, and the surface of the insulating film 76 is inactivated to form an insulating film 77. If the insulating film 74 consists of $SiO_2$, it has a polarity because an electronegativity difference is large. In a gas containing molecules having a polarity, therefore, gas molecules can be adsorbed in the $SiO_2$ layer. In the present invention, $SiH_3Cl$ and $N_2O$ were used as gases and flowed at a total pressure of 0.1 to 1 Torr, a substrate temperature of 400° C. to 500° C., and a gas flow rate ratio of 1:2. As a result, $SiO_2$ was not formed on the $W_2N$ exposed portion but was formed on the $SiO_2$ layer. The deposition rate was 50 nm/min. Selective growth of the $SiO_2$ layer can also be performed by liquid phase deposition. For example, when the above substrate is dipped in an aqueous solution containing 1 mol of $SiH_2F_6$, $SiO_2$ can be grown on only the $SiO_2$ layer. The deposition rate is as low as 10 nm/min. Note that selective growth can be similarly realized by using molecules having a strong polarity such as $SiCl_2$, $SiCl_3$, or $Si(CH_3)_3$ instead of $SiO_3Cl$ described above. Alternatively, oxygen radicals may be introduced instead of $N_2O$.

A wiring formation portion of the insulating film 76 except for the portion on the W plugs is removed by lithography and etching. In this case, since a margin corresponding to one contact hole is present, mask alignment does not require high alignment precision. Since it is difficult to perform mask alignment if flattening of the underlying layer is satisfactorily performed upon mask alignment, one more mask is additionally used after flattening, and a pattern is formed such that the insulating film is removed by etching in a region of an alignment mark. Subsequently, a 30-nm thick TiN layer 78 and a 400-nm thick Cu layer 79 are formed by anisotropic CVD.

TiN is deposited as follows. That is, a charge space consisting of electrons and ions is formed by using hydrogen as carrier gases and using diethylaminotitanium $Ti[N(C_2H_5)_2]_4$ gas and $N_2$ gas, and is transported to the substrate. The flow rate of the hydrogen carrier gas is 30 SCCM, and that of the nitrogen carrier gas is 10 SCCM. A negative bias (e.g., −60 to −80 V) is applied to the substrate by a floating potential. The substrate temperature is 100° C. to 250° C. In order to deposit Cu, HFA—Cu (hexafluoroacetylacetonecopper) gas is used to form a charge space with $H_2$, and Cu is deposited at a substrate temperature of 300° C. The substrate bias conditions are the same as for TiN. TiN and Cu deposited in this manner have (111) crystal orientation.

Figure 7L:
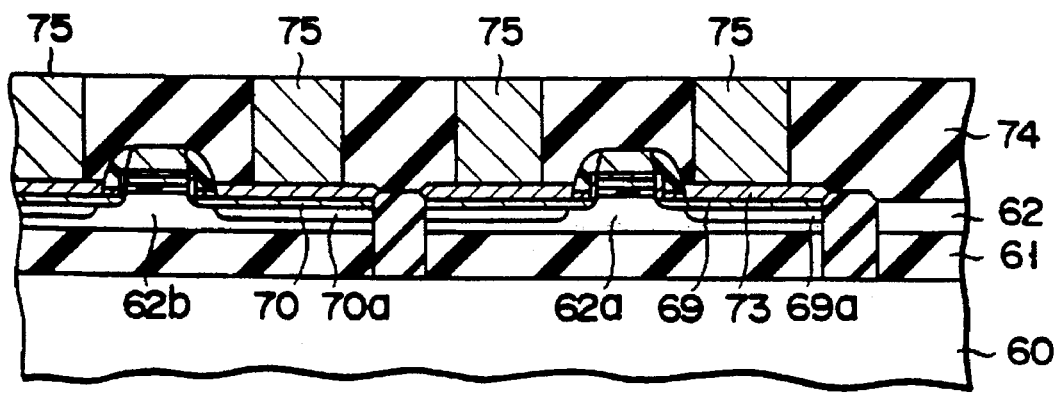
Figure 7M:
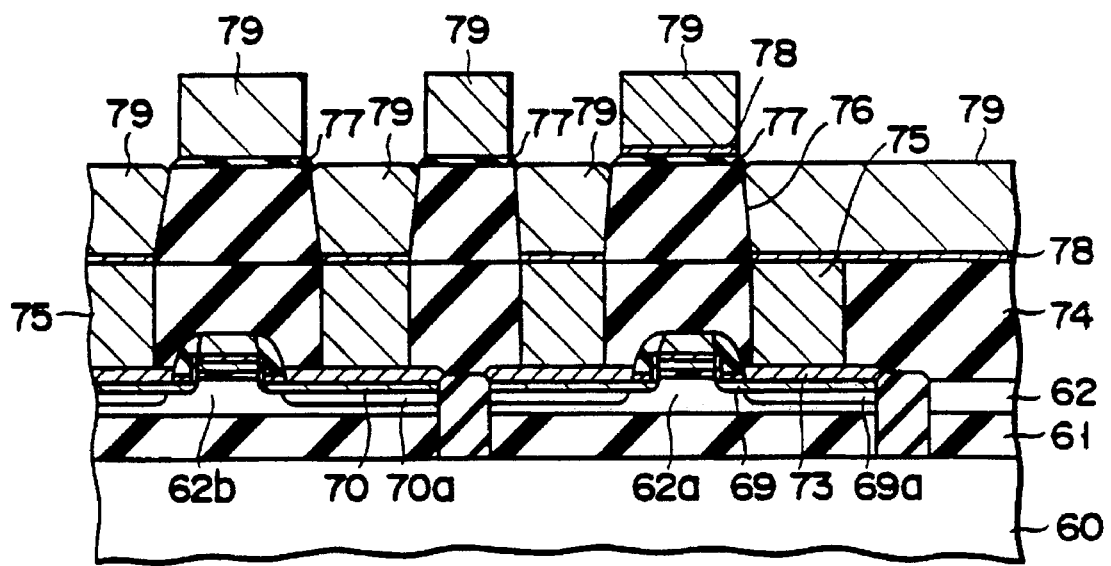
Figure 7N:
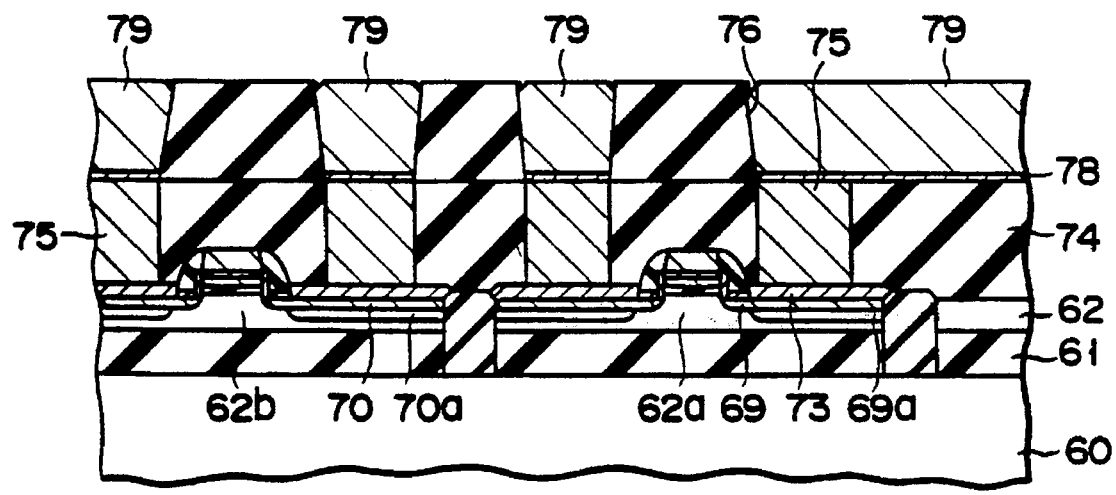

Subsequently, the substrate is dipped in a dilute fluoric acid solution ($HF:H_2O=1:100$). In this case, the oxygen concentration in the aqueous solution is reduced to be 1 ppm or less so as not to oxidize Cu. When the substrate is dipped in the dilute fluoric acid solution, since the etching rate of the layer 77 is high, the TiN layer 78 and the Cu layer 79 formed thereon are simultaneously lifted. As a result, a final structure as shown in FIG. 7N is obtained. A multilayered wiring structure of two or more layers can be formed by repeatedly performing the steps shown in FIGS. 7L to 7N.

When a transistor is formed by using the above method, the number of manufacturing steps can be reduced by 10 steps. When a five-layered wiring structure is formed by the method of the present invention, 20 or more manufacturing steps can be reduced, resulting in a large cost reduction. In addition, not only Cu or W but also Ag, Au, or a superconductive film all of which are difficult to be etched by conventional techniques can be used as an ultra micro wiring pattern. Furthermore, since a wiring pattern can be self-aligned on a contact without a clearance an interwiring space can be reduced to increase a degree of integration. When the interwiring space need not be reduced, since a capacitance between adjacent wiring patterns can be reduced, a wiring delay time can be shortened to increase an operation speed.

In this embodiment, formation of the electrode or wiring pattern is performed by anisotropic. CVD and liftoff. The pattern formation, however, can be similarly performed by using a selective growth method. In addition, in this embodiment, a lateral epitaxial growth layer on an Si oxide film is used as an active layer of the MOS transistor. Since solid-phase epitaxial growth propagates from a seed portion to both sides, however, a twinning boundary is easily formed on a boundary surface between growth surfaces. For this reason, a gate region must be formed separated from the boundary surface. In order not to form a twinning boundary immediately below the gate of the transistor, a method of crystallizing the surface layer of $SiO_2$ or the like to perform vertical epitaxial growth thereon is preferably performed.

A method of crystallizing the surface of $SiO_2$ will be described below with reference to FIGS. 8A to 8C.

After an $SiO_2$ film 82 is formed on an Si substrate 81, as shown in FIG. 8A, $F^+$ ions 83 are implanted, as shown in FIG. 8B. This ion implantation is performed under the conditions of 1 to 10 keV and $1\times10^{15}$ to $10^{16}$ $cm^{-2}$ so that the ions are distributed in the surface layer at a high concentration. Subsequently, a heat treatment is performed at a temperature of 400° C. or more or an energy beam is radiated to cause rearrangement of bonds in which F having a large electronegativity of 4.0 (polling scale) is replaced by O. As a result, since an ion bonding property of the surface layer of $SiO_2$ is enhanced to facilitate crystallization, an α crystobalite 84 is formed on the $SiO_2$ film 82, as shown in FIG. 8C. Although crystallization occurs on the surface of an $SiO_2$ film by performing a heat treatment at a temperature exceeding 1,100° C. or radiating an energy beam in an oxygen atmosphere without supplying F, the crystallization is accelerated by adding an element having a large electronegativity to form a larger single crystal. Al or Cu as a wiring material can be deposited with orientation on the formed single crystal by, e.g., vapor deposition, sputtering, or CVD.

Another method of growing a single crystal on the surface of $SiO_2$ will be described below with reference to FIGS. 9A to 9C.

Figure 9A:
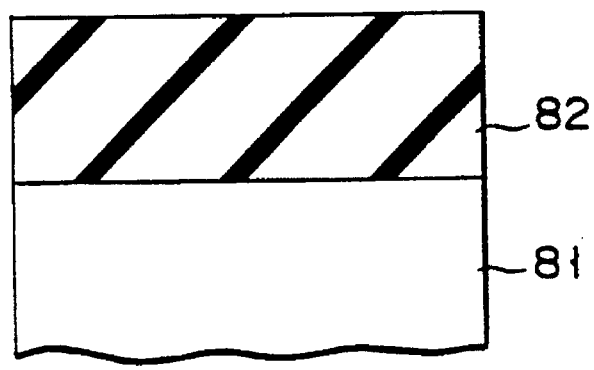
FIGS. 9A to 9C are sectional views showing another $SiO_2$ surface crystallization steps.
Figure 9B:
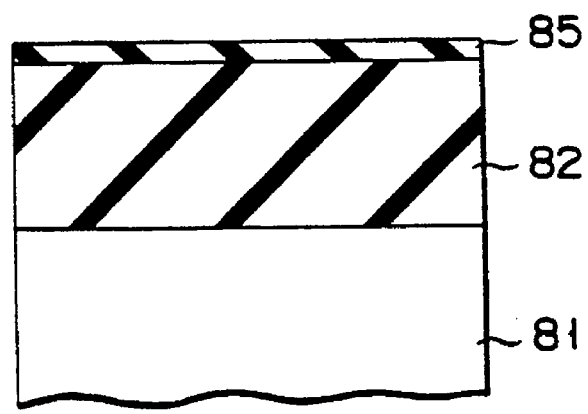
Figure 9C:
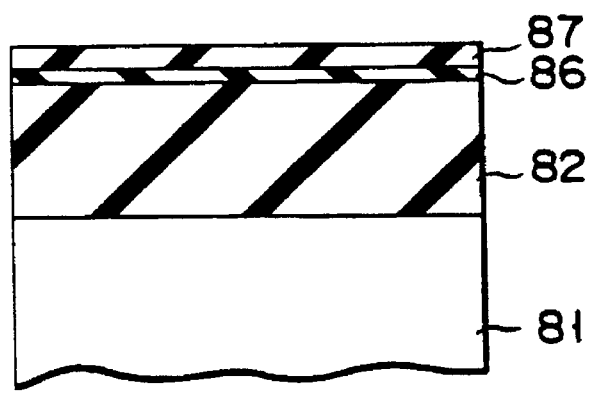

After an $SiO_2$ film 82 is formed on an Si substrate 81, as shown in FIG. 9A, a 20-nm thick Zr film 85 is deposited, as shown in FIG. 9B. Subsequently, an energy beam is radiated to cause the following reaction between the Zr film 85 and the $SiO_2$ film 82:

$5Zr + 4 SiO_2 \rightarrow Zr_5Si_4 + 4ZrO_2$ $Zr_5Si_4$ 86 is crystallized on the $SiO_2$ film 82, and $ZrO_2$ 87 is grown thereon with good matching property. Since $Zr_5Si_4$ formed in this manner has a better crystallinity than that of $Zr_5Si_4$ or $ZrSi_2$ formed directly on $SiO_2$, a single crystal of $ZrO_2$ can be grown thereon.

As described above, Si can be vertically epitaxially grown on an insulating film having a single-crystallized surface. When an Si film to be formed is a very thin film having a thickness of 100 nm or less, the performance of an element can be improved very effectively. Since a depletion layer at the end of a drain does not easily extend downward or toward a gate in a very thin film having a thickness of 100 nm or less, a transistor in which no punch-through occurs even if a gate length is 0.1 μm or less can be formed. In addition, an Si substrate may be used in a transistor having a gate length of 0.1 μm or more. When the Si substrate is used, the steps shown in FIG. 7A to 7C and mask alignment between the resist pattern 64a and the Si dioxide film 61 shown in FIGS. 7B and 7D, although the mask alignment requirement is not severe, can be omitted.

Since it is difficult to detect an alignment mark upon mask alignment when the flatness of an underlying layer is improved in the flattening step, an insulating film in a region of the alignment mark must be removed to project a metal in the region, i.e., a contrast must be formed. For example, after a metal plug is formed, a resist mask pattern is formed to expose the entire region of the alignment mark by coarse mask alignment, and an insulating film in the entire region of the alignment mark is etched by a thickness of 0.1 to 0.3 μm. This etching may be performed by using either a wet etchant such as $NH_4F$ or a dry etchant such as $SF_6/H_2$.

As has been described above in detail, the present invention uses various selective or anisotropic process techniques such as anisotropic oxidation of Si, anisotropic diffusion of an impurity, selective growth of a metal silicide, anisotropic selective growth of a metal film and a polycrystalline Si film, and anisotropic selective growth of an insulating film. As a result, the number of manufacturing steps can be decreased to realize a cost reduction, high-precision mask alignment need not be performed, a pattern free from exudation can be formed, a material which is difficult to be etched can be used, and an operation speed, a density, and reliability of an element can be improved accordingly.

What is claimed is:

1. A method of manufacturing a semiconductor device, comprising the steps of:
   forming a first insulating layer having an opening in which a first conductive layer is formed;
   selectively forming a second insulating layer on said first insulating layer;
   patterning said second insulating layer; and
   forming an interconnection layer in an opening portion of said second insulating layer so as to be electrically connected to said first conductive layer.

2. A method according to claim 1, wherein formation of said second insulating layer is performed by selective chemical vapor deposition.

3. A method according to claim 1, wherein formation of said second insulating layer is performed by directional selective chemical vapor deposition.

4. A method according to claim 3, wherein said directional selective chemical vapor deposition uses a polar compound as a feed gas.

5. A method according to claim 4, wherein said polar compound gas is a silicon compound gas selected from the group consisting of $SiH_3Cl$, $SiCl_2$, $SiCl_3$, and $Si(CH_3)_3$.

6. A method according to claim 1, wherein said first and second insulating layers consist of $SiO_2$.

7. A method according to claim 1, further comprising, before said step of forming said second insulating layer, the step of processing surfaces of said first insulating layer and said conductive layer by an $H_2$ plasma.

8. A method according to claim 1, further comprising the steps of:
   making insulative a surface of the part of said interconnection layer except for a portion on which a second conductive layer is to be formed;
   selectively forming a third insulating layer on said second insulating layer and the surface of said interconnection layer which is made insulative; and
   forming a second conductive layer on the portion of said interconnection layer which is not made insulative so as to be electrically connected to said interconnection layer.

9. A method of manufacturing a semiconductor device, comprising the steps of:
   forming a first insulating layer having an opening in which a first conductive layer is formed;
   making insulative a surface of the part of said first conductive layer except for the portion on which a second conductive layer is to be formed;
   selectively forming a second insulating layer on said first insulating layer and the surface of said first conductive layer which is made insulative; and
   forming a second conductive layer on the portion to said first conductive layer which is not made insulative so as to be electrically connected to said first conductive layer.

10. A method according to claim 9, wherein said step of making insulative the surface of the part of said first conductive layer is performed by radiating and scanning an ion beam of oxygen on the surface of the part of said first conductive layer.

11. A method according to claim 9, wherein said step of making insulative the surface of the part of said first conductive layer is performed by implanting oxygen or nitrogen ions in said first conductive layer through a masking layer.

12. A method according to claim 9, wherein said step of making insulative the surface of the part of said first conductive layer is performed by thermally oxidizing the surface of said first conductive layer through an antioxidation mask.

13. A method according to claim 9 wherein formation of said second insulating layer is performed by selective chemical vapor deposition.

14. A method according to claim 9, wherein formation of said second insulating layer is performed by directional selective chemical vapor deposition.

15. A method according to claim 14, wherein said directional selective chemical vapor deposition uses a polar compound gas as a feed gas.

16. A method according to claim 15, wherein said polar compound gas is a silicon compound gas selected from the group consisting of $SiH_3Cl$, $SiCl_2$, $SiCl_3$, and $Si(CH_3)_3$.

17. A method according to claim 9, wherein said first and second insulating layers consist of $SiO_2$.

18. A method according to claim 9, further comprising, before said step of forming said second insulating layer, a step of processing surfaces of said first insulating layer and said first conductive layer by an $H_2$ plasma.

19. A method according to claim 9, wherein said step of forming said first conductive layer is performed by selective chemical vapor deposition.

20. A method according to claim 9, wherein said step of forming said first conductive layer includes the substeps of performing directional chemical vapor deposition on the entire surface and performing mirror polishing.

21. A method according to claim 20, wherein said directional chemical vapor deposition is performed while a bias is applied on said substrate.

22. A method according to claim 9, wherein said step of forming said first conductive layer includes the substeps of performing directional chemical vapor deposition on the entire surface, depositing a planarizing material on the entire surface to planarize the surface, and performing etching-hack.

23. A method according to claim 20, wherein said step of forming said first conductive layer includes the substeps of forming a spacing layer on said first insulating layer, performing directional chemical vapor deposition on the entire surface to form a conductive layer, and removing said spacing layer to lift-off a portion of said conductive layer on said spacing layer.

24. A method according to claim 9, wherein said first conductive layer has an alignment mark and the portion of said first insulating layer around said alignment mark is removed to project said alignment mark.

25. A method according to claim 9, further comprising the steps of:

selectively forming a third insulating layer on said second conductive layer;

patterning said third insulating layer; and forming a third conductive layer in an opening portion of said third insulating layer so as to be electrically connected to said second conductive layer.

* * * * *